US012650455B2

(12) United States Patent
Sato

(10) Patent No.: US 12,650,455 B2
(45) Date of Patent: Jun. 9, 2026

(54) SEMICONDUCTOR DEVICE AND OVERCURRENT PROTECTION DEVICE

(71) Applicant: FUJI ELECTRIC CO., LTD., Kawasaki (JP)

(72) Inventor: Shigeki Sato, Azumino-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 165 days.

(21) Appl. No.: 18/602,638

(22) Filed: Mar. 12, 2024

(65) Prior Publication Data

US 2024/0219449 A1 Jul. 4, 2024

Related U.S. Application Data

(63) Continuation of application No. PCT/JP2023/014095, filed on Apr. 5, 2023.

(30) Foreign Application Priority Data

Apr. 8, 2022 (JP) ................................. 2022-064513

(51) Int. Cl.
G01R 31/26 (2020.01)
H02H 3/08 (2006.01)
(52) U.S. Cl.
CPC ........... *G01R 31/2617* (2013.01); *H02H 3/08* (2013.01)
(58) Field of Classification Search
CPC .... G01R 31/2617; H03K 17/00; H03K 17/08; H02H 3/08
See application file for complete search history.

(56) References Cited

U.S. PATENT DOCUMENTS

| | | | | | |
|---|---|---|---|---|---|
| 5,055,721 A | * | 10/1991 | Majumdar | ......... | H03K 17/0828 327/434 |
| 5,635,823 A | * | 6/1997 | Murakami | ........... | H03K 17/145 323/277 |
| 5,729,032 A | | 3/1998 | Tomomatsu et al. | | |

(Continued)

FOREIGN PATENT DOCUMENTS

| | | |
|---|---|---|
| JP | H07-240516 A | 9/1995 |
| JP | 2012-084625 A | 4/2012 |

(Continued)

OTHER PUBLICATIONS

International Search Report for PCT/JP2023/014095, mailed on Jun. 20, 2023.
Written Opinion for PCT/JP2023/014095, mailed on Jun. 20, 2023.

*Primary Examiner* — Thang X Le
(74) *Attorney, Agent, or Firm* — Rabin & Berdo, P.C.

(57) ABSTRACT

A semiconductor device, including: an output element having a gate, the output element being configured to perform switching to thereby operate a load of the semiconductor device in accordance with a drive signal applied to the gate thereof; a current monitoring element having a gate and a sense emitter, the current monitoring element being configured to monitor a current flowing through the output element; and a voltage division circuit, which is connected between the gate of the output element and the sense emitter of the current monitoring element, which divides a voltage of the drive signal applied to the gate of the output element, and which applies an obtained voltage to the gate of the current monitoring element.

8 Claims, 6 Drawing Sheets

(56) References Cited

U.S. PATENT DOCUMENTS

| | | |
|---|---|---|
| 2015/0171070 A1 | 6/2015 | Hanaoka |
| 2015/0185275 A1 | 7/2015 | Sekigawa |
| 2017/0244246 A1 | 8/2017 | Kawamoto |
| 2018/0145503 A1* | 5/2018 | Minagawa .......... H02M 7/5387 |
| 2019/0273488 A1* | 9/2019 | Reiter ............. H03K 17/08116 |
| 2019/0280473 A1 | 9/2019 | Akahane |
| 2020/0028505 A1* | 1/2020 | Sasaki ................. H10D 12/411 |

FOREIGN PATENT DOCUMENTS

| | | |
|---|---|---|
| JP | 2015-119521 A | 6/2015 |
| JP | 2017-152923 A | 8/2017 |
| JP | 2019-149558 A | 9/2019 |
| JP | 2020-014103 A | 1/2020 |
| WO | 2014/097739 A1 | 6/2014 |
| WO | 2018/211840 A1 | 11/2018 |

* cited by examiner

SEMICONDUCTOR DEVICE AND OVERCURRENT PROTECTION DEVICE

CROSS-REFERENCE TO RELATED APPLICATION

This application is a continuation application of International Application PCT/JP2023/014095 filed on Apr. 5, 2023, which designated the U.S., which claims priority to Japanese Patent Application No. 2022-064513, filed on Apr. 8, 2022, the entire contents of which are incorporated herein by reference.

BACKGROUND OF THE INVENTION

1. Field of the Invention

The embodiment discussed herein relates to a semiconductor device and an overcurrent protection device.

2. Background of the Related Art

In recent years, the development of silicon carbide (SiC) elements, gallium nitride (GaN) elements, or the like, which are next generation semiconductor elements, has been promoted as a next generation technology of insulated gate bipolar transistors (IGBTs) which are power semiconductor elements.

For example, a technique for detecting an overcurrent by the use of a circuit in which a voltage division resistor is located between a gate of a main IGBT and a gate of a sense IGBT is proposed as a related art (Japanese Laid-open Patent Publication No. 2020-14103). Furthermore, a technique for detecting a transient sense period of a detection signal of a sense current according to turn on of a semiconductor element and controlling the semiconductor element on the basis of the detection signal of the sense current during the transient sense period is proposed as a related art (International Publication Pamphlet No. WO 2018/211840). In addition, a technique for preventing erroneous detection of an overcurrent by applying a gate signal indicating conductivity to a gate of a sense element earlier than to a main element is proposed as a related art (International Publication Pamphlet No. WO 2014/097739).

A semiconductor device referred to as an intelligent power switch (IPS) includes a main IGBT which is a power semiconductor element for operating a load and a sense IGBT which is a power semiconductor element for performing current monitoring by passing a sense current proportional to a current flowing through the main IGBT. Furthermore, the IPS includes an overcurrent detection circuit which detects an overcurrent of the main IGBT on the basis of a detection signal of the sense current (sense current detection signal).

With the above IPS, ideally, the main current and the sense current begin to flow at the same timing when the same drive signal is input to a gate terminal of the main IGBT and a gate terminal of the sense IGBT.

However, the main IGBT and the sense IGBT differ in size. Accordingly, imbalance appears between the characteristics of the main IGBT and the characteristics of the sense IGBT because of a difference in parasitic capacitance at the gate terminals (in gate-emitter capacitor and gate-collector capacitor).

If there is an imbalance between the characteristics of the main IGBT and the characteristics of the sense IGBT, then current concentration occurs in the sense IGBT during an IGBT turn-on period. That is to say, before a collector current of the main IGBT rises, a transient sense current flows through the sense IGBT. As a result, current concentration occurs in the sense IGBT.

If current concentration occurs in the sense IGBT, then an overcurrent detection circuit may erroneously detect an overcurrent. If the overcurrent detection circuit erroneously detects an overcurrent, then the overcurrent detection circuit outputs an overcurrent detection signal. As a result, driving the main IGBT is erroneously stopped.

According to the above Japanese Laid-open Patent Publication No. 2020-14103, in order to suppress the above current concentration in the sense IGBT, voltage division resistors are used and control is exercised to make a gate voltage of the main IGBT and a gate voltage of the sense IGBT different.

FIG. 6 illustrates the structure of a conventional semiconductor device including voltage division resistors. As stated in Japanese Laid-open Patent Publication No. 2020-14103, a semiconductor device 2 includes a main IGBT 101, a sense IGBT 102, and a voltage division circuit 2c. The voltage division circuit 2c includes a resistor Rdiv11 and a resistor Rdiv12.

A collector of the main IGBT 101 and a collector of the sense IGBT 102 are connected to a terminal C. A sense emitter of the sense IGBT 102 is connected to a terminal SE. A gate of the main IGBT 101 is connected to a terminal G and one end of the resistor Rdiv11. The other end of the resistor Rdiv11 is connected to a gate of the sense IGBT 102 and one end of the resistor Rdiv12. The other end of the resistor Rdiv12 is connected to an emitter of the main IGBT 101 and a terminal E.

With the semiconductor device 2, the resistor Rdiv11 is located between the gate of the main IGBT 101 and the gate of the sense IGBT 102 and the resistor Rdiv12 is located between the gate of the sense IGBT 102 and the emitter of the main IGBT 101.

With the above structure, a voltage applied to the gate of the sense IGBT 102 is set lower than a voltage applied to the gate of the main IGBT 101 to make a current of the main IGBT 101 and a current of the sense IGBT 102 rise at the same time. This suppresses current concentration in the sense IGBT 102.

However, an IGBT 100 includes a gate wiring. Accordingly, an effective voltage applied to a gate of the IGBT 100 is lower than a gate voltage output from a gate driver. Furthermore, with the semiconductor device 2, the other end of the resistor Rdiv12 is connected to the emitter of the main IGBT 101 in which a drop in voltage is larger than a drop in voltage in the sense emitter of the sense IGBT 102.

If the above structure is adopted, then there is a possibility that a gate current output from the gate driver will flow to the resistors Rdiv11 and Rdiv12 connected in series rather than flow to the gate of the IGBT 100.

As a result, following phenomenon takes place. A gate voltage of the main IGBT 101 and a gate voltage of the sense IGBT 102 are lower than proper values and each gate is not charged with a proper voltage. This makes it difficult to drive the IGBT 100 with accuracy.

SUMMARY OF THE INVENTION

According to an aspect, there is provided a semiconductor device, including: an output element having a gate, the output element being configured to perform switching to thereby operate a load of the semiconductor device in accordance with a drive signal applied to the gate thereof; a current monitoring element having a gate and a sense emitter, the current monitoring element being configured to monitor a current flowing through the output element; and a voltage division circuit, which is connected between the gate of the output element and the sense emitter of the current monitoring element, which divides a voltage of the drive signal applied to the gate of the output element, and which applies an obtained voltage to the gate of the current monitoring element.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
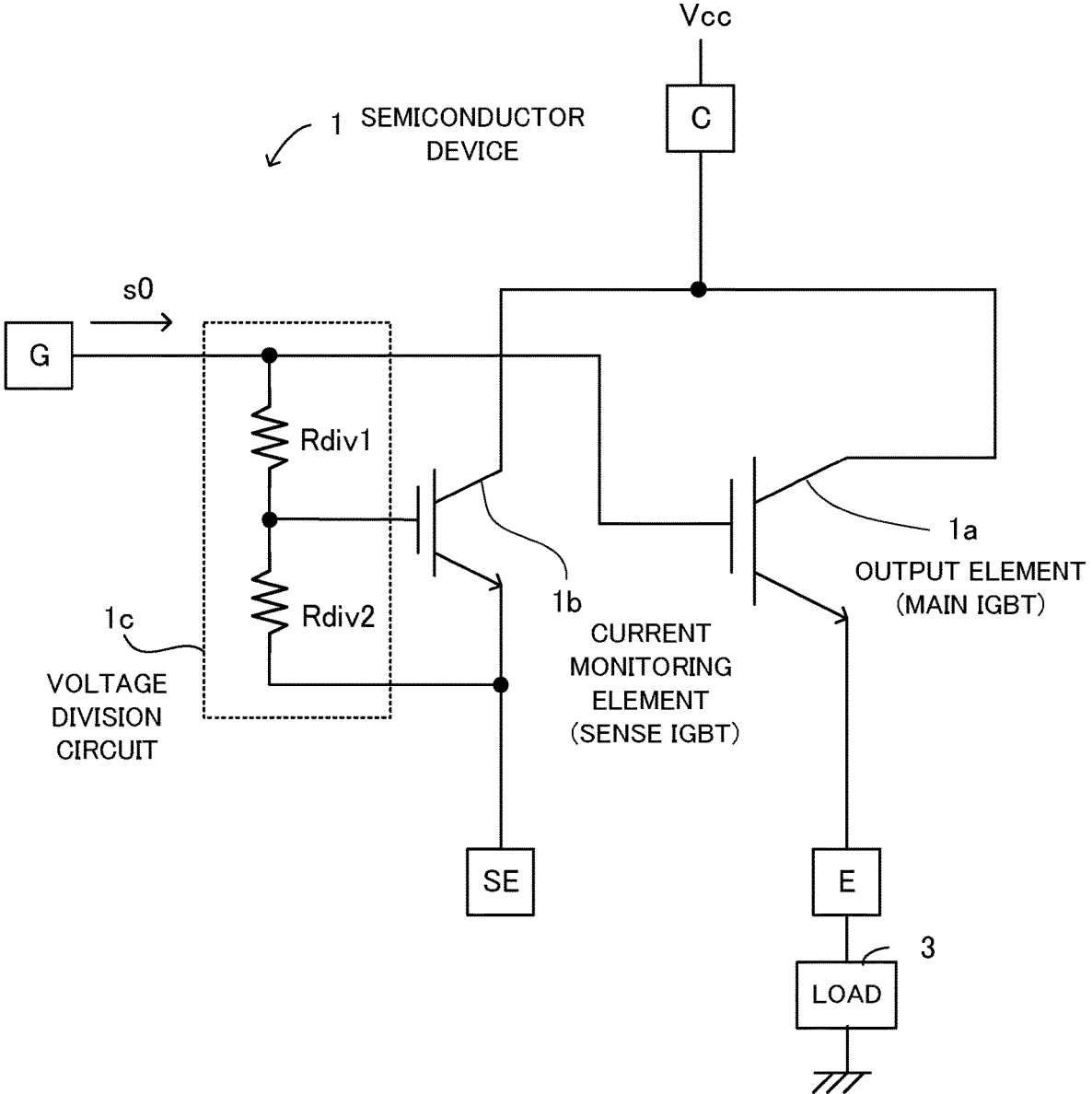
FIG. 1 is a view for describing an example of a semiconductor device.

An embodiment will now be described by referring to the drawings. Components in the specification and the drawings having virtually the same function are marked with the same numeral. By doing so, a duplicate description may be omitted.

FIG. 1 is a view for describing an example of a semiconductor device. A semiconductor device 1 includes an output element 1a, a current monitoring element 1b, and a voltage division circuit 1c. The voltage division circuit 1c includes a resistor Rdiv1 (first resistor) and a resistor Rdiv2 (second resistor).

Each of the output element 1a and the current monitoring element 1b is an IGBT, a reverse conducting (RC)-IGBT formed by mounting an IGBT and a free wheeling diode (FWD) over one chip, or the like. Alternatively, a silicon carbide (SiC) device may be used. The SiC device is an SiC-metal-oxide-semiconductor field-effect transistor (MOSFET) or the like. In the following description, an output element and a current monitoring element will be referred to as a main IGBT and a sense IGBT respectively.

A collector of the main IGBT 1a and a collector of the sense IGBT 1b are connected via a terminal C to a power supply voltage Vcc. An emitter of the main IGBT 1a is connected via a terminal E to a load 3.

A gate of the main IGBT 1a is connected to a terminal G and one end of the resistor Rdiv1. The other end of the resistor Rdiv1 is connected to a gate of the sense IGBT 1b and one end of the resistor Rdiv2. The other end of the resistor Rdiv2 is connected to a sense emitter of the sense IGBT 1b and a terminal SE.

The main IGBT 1a performs switching on the basis of a drive signal s0 and operates the load 3. If instructions to turn on the main IGBT 1a are given by the drive signal s0, then the main IGBT 1a turns on. The main IGBT 1a passes a current from the collector to the emitter. Furthermore, the sense IGBT 1b monitors a current flowing through the main IGBT 1a. If the instructions to turn on the main IGBT 1a are given by the drive signal s0, then the sense IGBT 1b passes a sense current proportional to the current flowing through the main IGBT 1a from the collector to the sense emitter.

In addition, the voltage division circuit 1c is connected between the gate of the main IGBT 1a and the sense emitter of the sense IGBT 1b, divides the voltage of the drive signal s0 applied to the gate of the main IGBT 1a, and applies an obtained voltage to the gate of the sense IGBT 1b.

The main IGBT 1a and the sense IGBT 1b included in the semiconductor device 1 are formed over the same semiconductor substrate. For example, the resistors Rdiv1 and Rdiv2 are formed of polycrystalline silicon over the semiconductor substrate over which the main IGBT 1a and the sense IGBT 1b are formed. Furthermore, the semiconductor device 1 includes these components and is formed as one chip.

The voltage of the drive signal so input from the terminal G is supplied directly to the gate terminal of the main IGBT 1a. A voltage obtained by dividing the gate voltage by the resistors Rdiv1 and Rdiv2 is supplied to the gate terminal of the sense IGBT 1b.

A voltage applied to the gate of the sense IGBT 1b is set lower in this way than a voltage applied to the gate of the main IGBT 1a. By doing so, the rising of a current of the sense IGBT 1b comes after the rising of a current of the main IGBT 1a. As a result, a current of the sense IGBT 1b does not rise earlier than a current of the main IGBT 1a. That is to say, current concentration does not occur in the sense IGBT 1b and a transient sense current is suppressed.

Furthermore, a delay in the rising of a current of the sense IGBT 1b is set by a voltage division ratio which depends on the resistance values of the resistors Rdiv1 and Rdiv2. For example, the resistance values of the resistors Rdiv1 and Rdiv2 are adjusted so that the rising of a current of the sense IGBT 1b will coincide with the rising of a current of the main IGBT 1a. Such an adjustment of a voltage division ratio is made by using a trimming technique, such as laser trimming, for one or both of the resistors Rdiv1 and Rdiv2.

Figure 6:
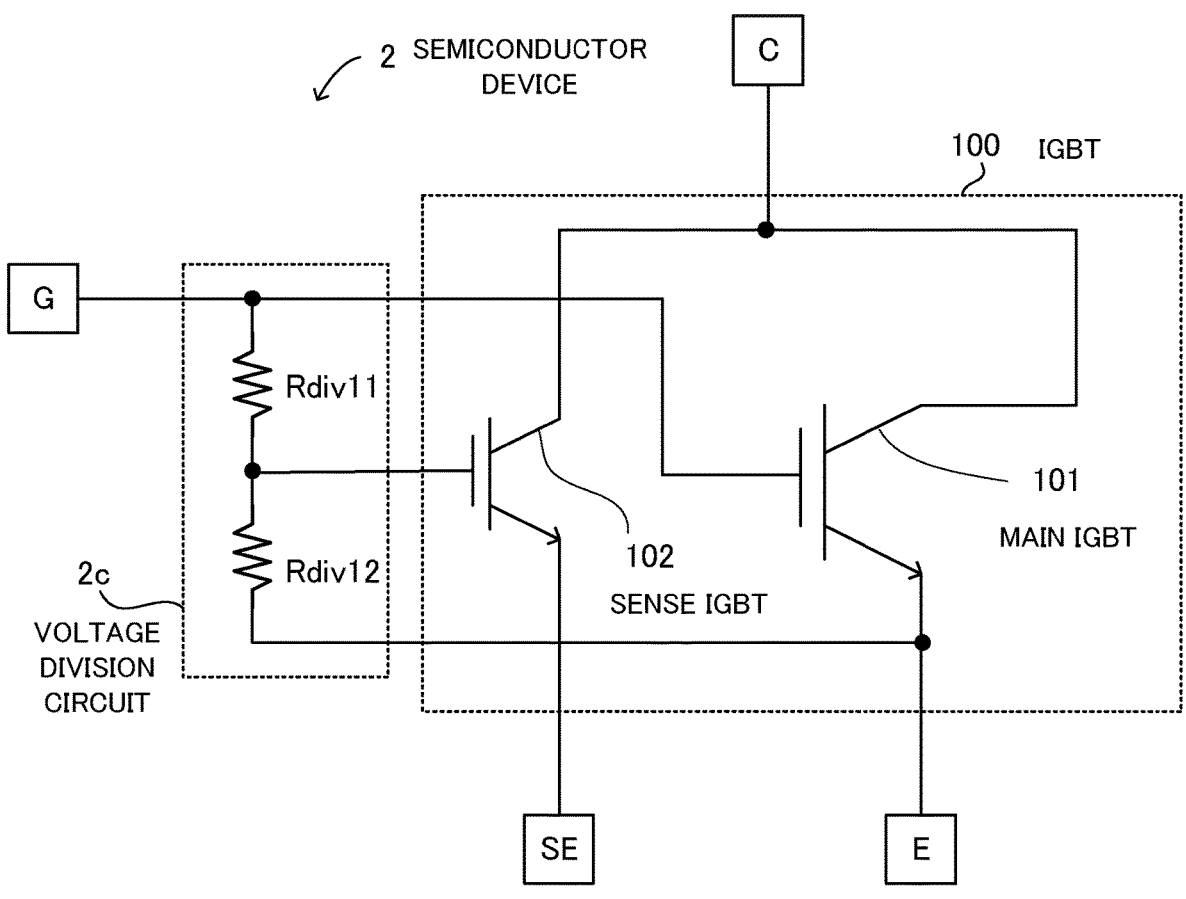
FIG. 6 illustrates the structure of a conventional semiconductor device including voltage division resistors.

Furthermore, with the semiconductor device 2 illustrated in FIG. 6, the other end of the resistor Rdiv12 is connected to the emitter of the main IGBT 101. With the semiconductor device 1 according to the embodiment, however, the other end of the resistor Rdiv2 is connected to the sense emitter of the sense IGBT 1b. By adopting this structure, the flow of a gate current output from a gate driver to the voltage division resistors is suppressed compared with the structure of the semiconductor device 2. As a result, the gates of the main IGBT 1a and the sense IGBT 1b are charged with a proper voltage. That is to say, properly charging the gates of the main IGBT 1a and the sense IGBT 1b is also improved by adopting the structure of the semiconductor device 1.

Figure 2:
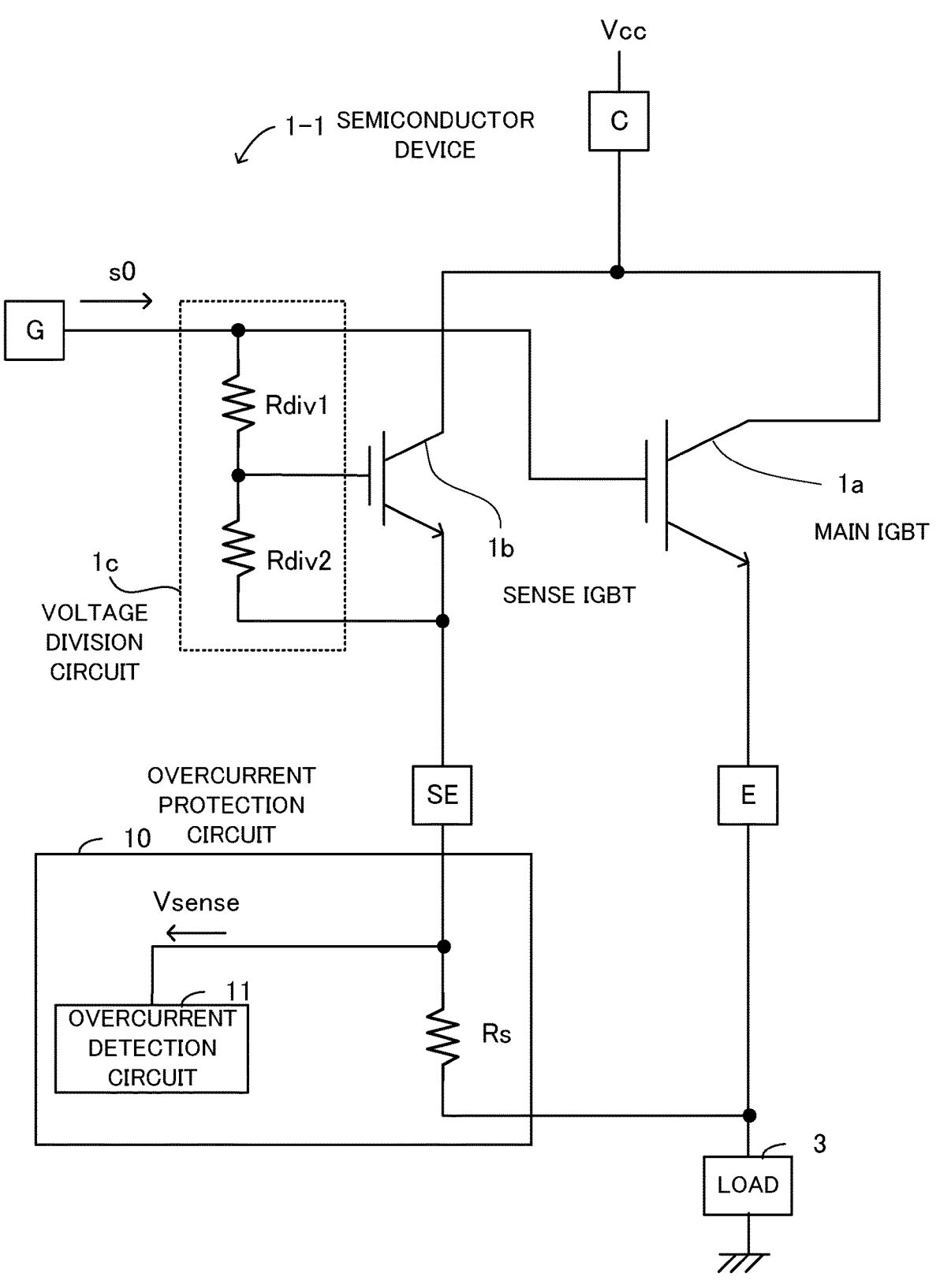
FIG. 2 illustrates an example of the structure of a semiconductor device including an overcurrent protection circuit.

FIG. 2 illustrates an example of the structure of a semiconductor device including an overcurrent protection circuit. A semiconductor device 1-1 includes a main IGBT 1a, a sense IGBT 1b, a voltage division circuit 1c, and an overcurrent protection circuit 10. The overcurrent protection circuit 10 includes a resistor Rs (current detection resistor) and an overcurrent detection circuit 11.

One end of the resistor Rs is connected to a sense emitter of the sense IGBT 1b, the other end of a resistor Rdiv2, and an input end of the overcurrent detection circuit 11. The other end of the resistor Rs is connected to an emitter of the main IGBT 1a and a load 3.

A sense current detection signal Vsense obtained by converting a sense current output from the sense IGBT 1*b* to a voltage is output from the one end of the resistor Rs. Furthermore, the overcurrent detection circuit 11 detects an overcurrent state of the main IGBT 1*a* by comparing the sense current detection signal Vsense with a reference voltage.

The above semiconductor device 1-1 includes the voltage division circuit 1*c* which is connected between a gate of the main IGBT 1*a* and the sense emitter of the sense IGBT 1*b* and which applies to a gate of the sense IGBT 1*b* a voltage obtained by dividing the voltage of a drive signal so applied to the gate of the main IGBT 1*a*. As a result, the gates of the main IGBT 1*a* and the sense IGBT 1*b* are charged with a proper voltage. Accordingly, the main IGBT 1*a* and the sense IGBT 1*b* are driven with accuracy and erroneous detection of an overcurrent is prevented.

Furthermore, usually a discrete part is used as the resistor Rs. Accordingly, there is great flexibility in setting a constant. In addition, if the resistor Rs is mounted inside an IGBT chip, then a restriction on area is small. With the semiconductor device 1-1, the other end of the resistor Rdiv2 is connected to the sense emitter of the sense IGBT 1*b*. As a result, the resistance values of the resistors Rdiv1 and Rdiv2 and the resistance value of the resistor Rs may be added up. Accordingly, if area for locating the resistors Rdiv1 and Rdiv2 having a combined resistance value greater than or equal to a determined value is not ensured in the IGBT chip, then the resistor Rs may be used in place of the resistors Rdiv1 and Rdiv2.

In addition, by adjusting the voltage division ratio of the resistors Rdiv1 and Rdiv2, the timing of the rising of a current of the main IGBT 1*a* and a current of the sense IGBT 1*b* is adjusted. Accordingly, an overcurrent of the main IGBT 1*a* is detected by the sense IGBT 1*b* in real time without delay.

(Combined Resistance Value of Voltage Division Resistors)

With the semiconductor device 1, as stated above, the other end of the resistor Rdiv2 is connected to the sense emitter of the sense IGBT 1*b*. By adopting this structure, the flow of a gate current output from the gate driver to the voltage division resistors is suppressed. In addition to this, the flow of a gate current output from the gate driver to the voltage division resistors is suppressed further by setting a combined resistance value of the resistors Rdiv1 and Rdiv2 greater than or equal to a determined value. In this case, for example, a combined resistance value of the resistors Rdiv1 and Rdiv2 is greater than or equal to 10Ω.

(Simulation Results)

Simulation results obtained by comparing the semiconductor device 1 according to the embodiment with the conventional semiconductor device 2 will now be described by the use of FIG. 3 and FIG. 4.

Figure 3:
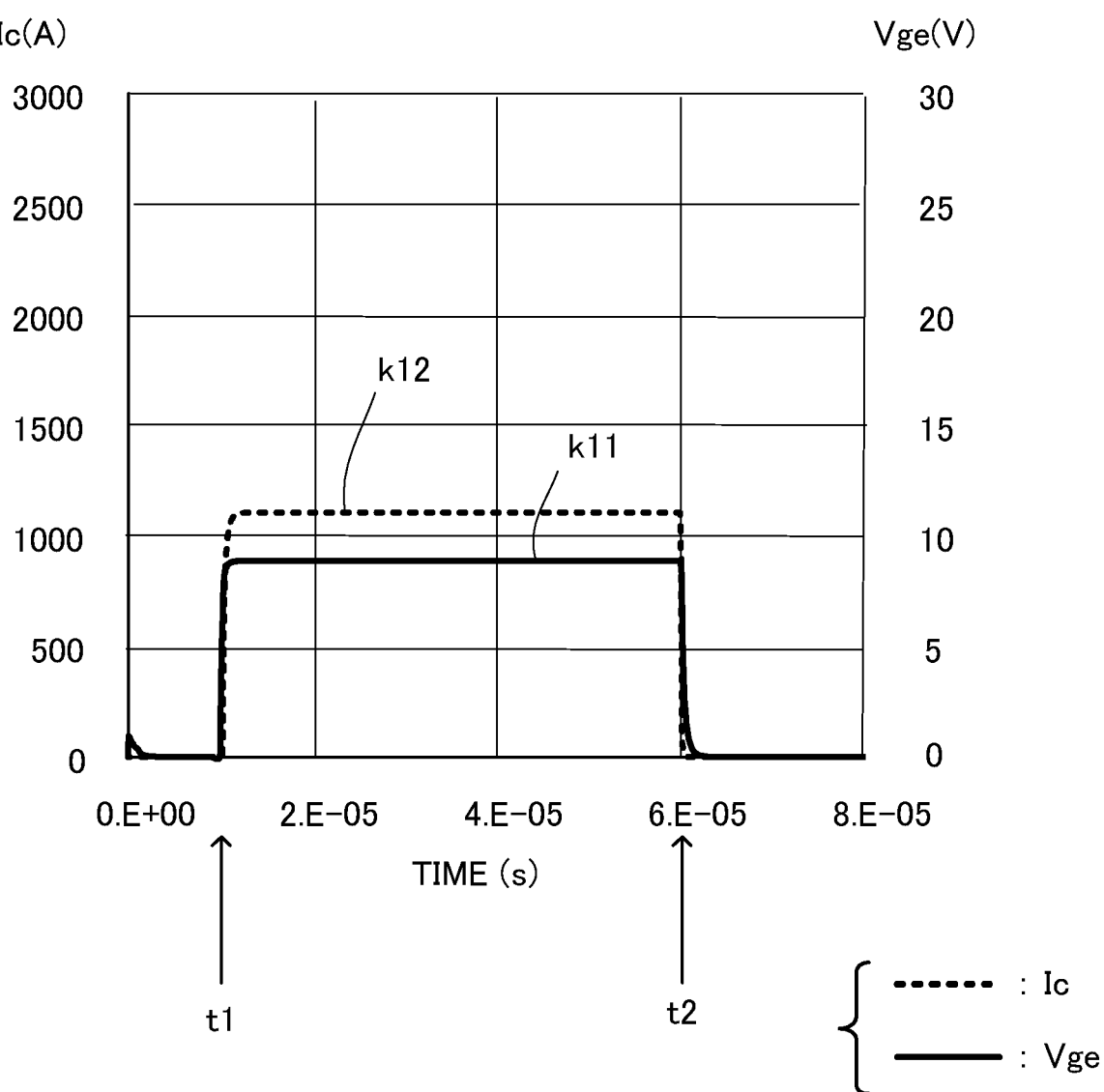
FIG. 3 illustrates an example of a simulation waveform.

FIG. 3 illustrates an example of a simulation waveform. Simulation waveforms of a collector current Ic and a gate voltage Vge in the semiconductor device 2 illustrated in FIG. 6 are illustrated. In FIG. 3, a left vertical axis indicates a collector current Ic (A) of the main IGBT 101, a right vertical axis indicates a gate voltage Vge (V) of the main IGBT 101, and a horizontal axis indicates time (s). A combined resistance value of the resistors Rdiv11 and Rdiv12 included in the semiconductor device 2 is set so as to be smaller than 10Ω.

(Waveform k11) Waveform k11 indicates the gate voltage Vge of the main IGBT 101. At time t1 the main IGBT 101 begins to turn on. At time t2 the main IGBT 101 begins to turn off.

(Waveform k12) Waveform indicates the collector current Ic of the main IGBT 101. Because at time t1 the main IGBT 101 turns on, the collector current Ic flows and a constant value is kept. After that, at time t2 the main IGBT 101 turns off. As a result, the collector current Ic decreases.

Figure 4:
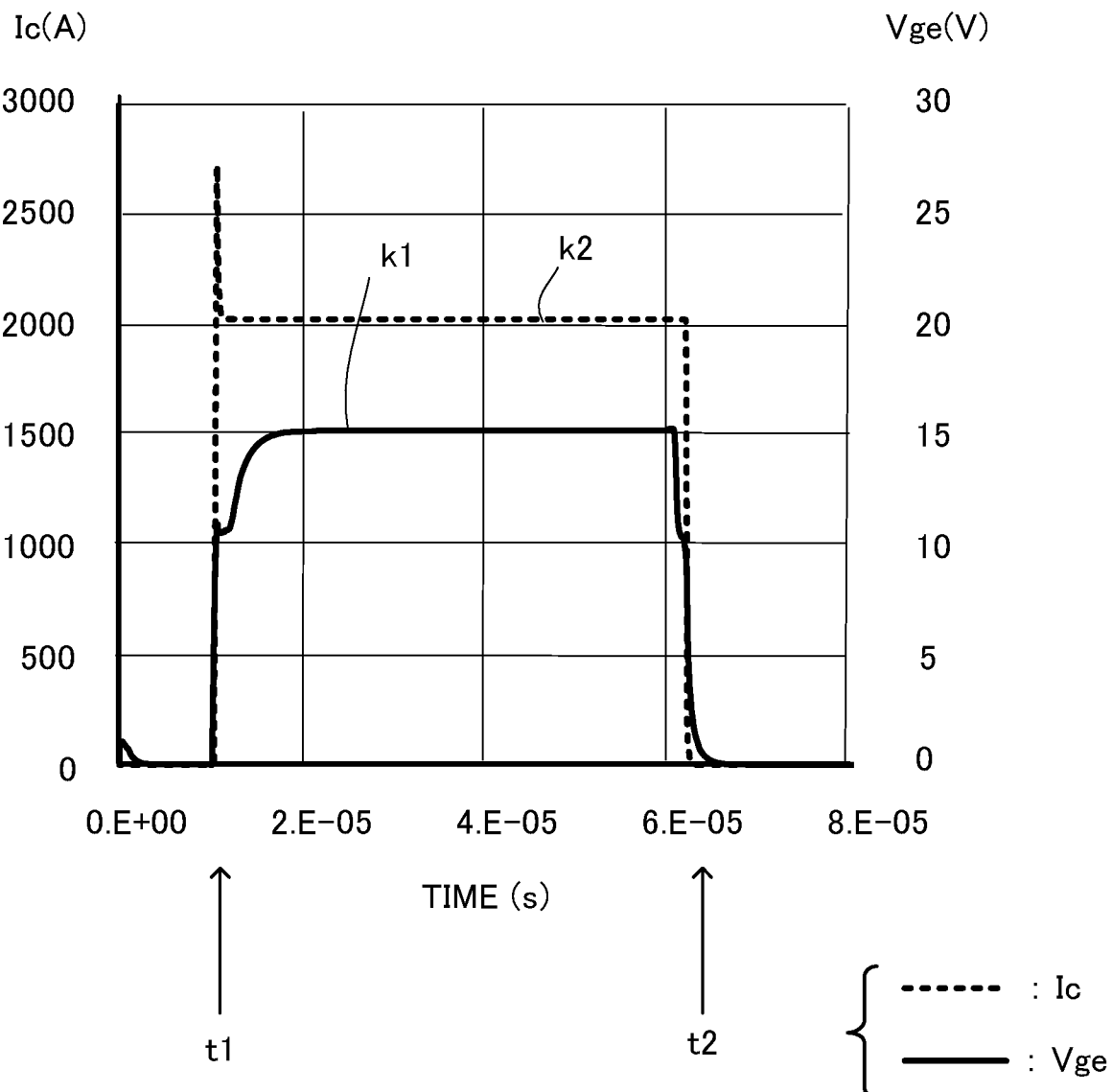
FIG. 4 illustrates an example of a simulation waveform.

FIG. 4 illustrates an example of a simulation waveform. Simulation waveforms of a collector current Ic and a gate voltage Vge in the semiconductor device 1 according to the embodiment illustrated in FIG. 1 are illustrated. In FIG. 4, a left vertical axis indicates a collector current Ic (A) of the main IGBT 1*a*, a right vertical axis indicates a gate voltage Vge (V) of the main IGBT 1*a*, and a horizontal axis indicates time (s). A combined resistance value of the resistors Rdiv1 and Rdiv2 included in the semiconductor device 1 is set so as to be greater than or equal to 10Ω.

(Waveform k1) Waveform k1 indicates the gate voltage Vge of the main IGBT 1*a*. At time t1 the main IGBT 1*a* begins to turn on. At time t2 the main IGBT 1*a* begins to turn off.

(Waveform k2) Waveform k2 indicates the collector current Ic of the main IGBT 1*a*. Because at time t1 the main IGBT 1*a* turns on, the collector current Ic flows and a constant value is kept. After that, at time t2 the main IGBT 1*a* turns off. As a result, the collector current Ic decreases.

It is assumed that a proper value of a gate voltage of a main IGBT is 15 V. With the conventional semiconductor device 2, a gate current output from the gate driver flows to the voltage division resistors and a proper voltage is not applied to the gate. As a result, as illustrated in the simulation waveform of FIG. 3, the gate voltage does not reach 15 V.

With the semiconductor device 1 according to the embodiment, on the other hand, the flow of a gate current output from the gate driver to the voltage division resistors is suppressed. Accordingly, a proper voltage is applied to the gate. That is to say, as illustrated in the simulation waveform of FIG. 4, the gate voltage reaches 15 V.

(Overcurrent Protection Device)

Figure 5:
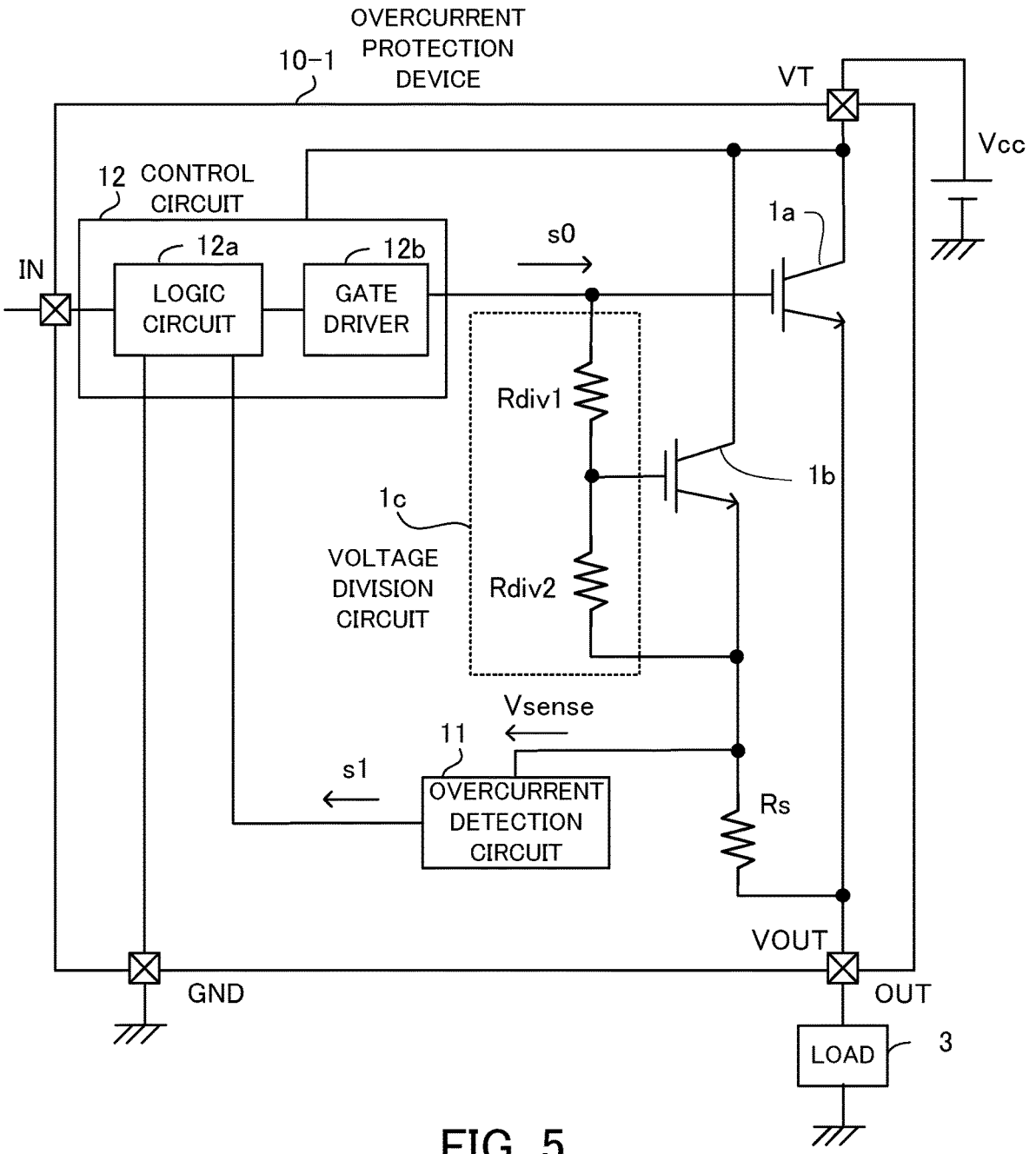
FIG. 5 illustrates an example of the structure of an overcurrent protection device.

An overcurrent protection device to which the semiconductor device 1 according to the embodiment is applied will now be described. FIG. 5 illustrates an example of the structure of an overcurrent protection device. An overcurrent protection device 10-1 includes an input terminal IN, an output terminal OUT, a power supply terminal VT, and an earth terminal GND.

A pulsed control signal output from a microcomputer or the like is input to the input terminal IN. A load 3 is connected to the output terminal OUT. A power supply voltage Vcc is connected to the power supply terminal VT and ground (GND) is connected to the earth terminal GND.

Furthermore, the overcurrent protection device 10-1 includes a main IGBT 1*a*, a sense IGBT 1*b*, a voltage division circuit 1*c*, a resistor Rs (current detection resistor), an overcurrent detection circuit 11, and a control circuit 12. The control circuit 12 includes a logic circuit 12*a* and a gate driver 12*b*.

The logic circuit 12*a* receives the control signal input via the input terminal IN and generates a logic signal to turn on or off the main IGBT 1*a*. The gate driver 12*b* generates on the basis of the logic signal output from the logic circuit 12*a* a drive signal so to turn on or off the main IGBT 1*a*, and applies it to a gate of the main IGBT 1*a*.

The resistor Rs is connected between a sense emitter of the sense IGBT 1*b* and an emitter of the main IGBT 1*a*. A sense current flowing out of the sense emitter flows through the resistor Rs. A potential produced is detected by the resistor Rs. As a result, the sense current is detected as a sense current detection signal Vsense.

The overcurrent detection circuit 11 compares the sense current detection signal Vsense with a reference voltage to detect whether or not the main IGBT 1a is in an overcurrent state. If the overcurrent detection circuit 11 detects an overcurrent state of the main IGBT 1a, then the overcurrent detection circuit 11 outputs an overcurrent detection signal s1. When the logic circuit 12a detects the overcurrent detection signal s1, the logic circuit 12a turns off the main IGBT 1a.

As stated above, the overcurrent protection device 10-1 having the structure of the semiconductor device 1 illustrated in FIG. 1 includes the voltage division circuit 1c. The voltage division circuit 1c is connected between the gate of the main IGBT 1a and the sense emitter of the sense IGBT 1b, divides the voltage of the drive signal s0 applied to the gate of the main IGBT 1a, and applies a voltage obtained to a gate of the sense IGBT 1b.

As a result, the gates of the main IGBT 1a and the sense IGBT 1b are charged with a proper voltage. Accordingly, the main IGBT 1a and the sense IGBT 1b are driven with accuracy and erroneous detection of an overcurrent is prevented.

As has been described in the foregoing, according to the present disclosure, the voltage division circuit 1c is connected between the gate of the main IGBT 1a and the sense emitter of the sense IGBT 1b, divides the voltage of the drive signal s0 applied to the gate of the main IGBT 1a, and applies a voltage obtained to the gate of the sense IGBT 1b.

This makes it possible to suppress the flow of a gate current to the voltage division resistors, while retaining suppression of current concentration in the sense IGBT 1b. As a result, the gates of the main IGBT 1a and the sense IGBT 1b are charged with a proper voltage. Properly charging the gates is also improved.

The embodiment has been taken as an example. The structure of each section indicated in the embodiment may be replaced by another structure having the same function. Furthermore, any other component or process may be added. Moreover, any two or more structures (features) of the above embodiment may be combined.

According to an aspect, a gate of a power semiconductor element for load operation and a gate of a power semiconductor element for current monitoring are charged with a proper voltage.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device, comprising:
an output element having a gate, the output element being configured to perform switching to thereby operate a load of the semiconductor device in accordance with a drive signal applied to the gate thereof;

a current monitoring element having a gate and a sense emitter, the current monitoring element being configured to monitor a current flowing through the output element; and a voltage division circuit, which is connected between the gate of the output element and the sense emitter of the current monitoring element, which divides a voltage of the drive signal applied to the gate of the output element, and which applies an obtained voltage to the gate of the current monitoring element.

2. The semiconductor device according to claim 1, wherein:
the voltage division circuit include a first resistor and a second resistor connected in series;

the first resistor has one end thereof connected to the gate of the output element, and the other end thereof connected to the gate of the current monitoring element; and the second resistor has one end thereof connected to said the other end of the first resistor, and the other end thereof connected to the sense emitter of the current monitoring element.

3. The semiconductor device according to claim 2, wherein a combined resistance value of the first resistor and the second resistor is greater than or equal to 10 Ω.

4. The semiconductor device according to claim 2, further comprising:
a current detection resistor configured to output a sense current detection signal, which is a voltage generated at the current detection resistor by a sense current output from the current monitoring element; and an overcurrent detection circuit which detects an overcurrent state of the output element by comparing the sense current detection signal with a reference voltage.

5. The semiconductor device according to claim 4, wherein:
the current detection resistor has two ends that are respectively a first end and a second end;

the output element further has a collector and an emitter;

the current monitoring element further has a collector;

the sense emitter of the current monitoring element is connected to the first end of the current detection resistor and an input end of the overcurrent detection circuit;

the collector of the output element is connected to the collector of the current monitoring element and a power supply voltage; and the emitter of the output element is connected to the second end of the current detection resistor and the load.

6. The semiconductor device according to claim 1, wherein each of the output element and the current monitoring element is a power semiconductor element and is one of an insulated gate bipolar transistor (IGBT), a reverse conducting (RC)-IGBT, or a silicon carbide (SiC) device.

7. An overcurrent protection device having a power supply terminal and an output terminal, the overcurrent protection device comprising:
an output element having a gate, the output element
being connected via the power supply terminal to a power supply voltage,
being connected via the output terminal to a load of the overcurrent protection device, and
being configured to perform switching to thereby operate the load in accordance with a drive signal applied to the gate thereof;

a current monitoring element having a gate and a sense emitter, the current monitoring element being configured to monitor a current flowing through the output element;

a voltage division circuit, which is connected between the gate of the output element and the sense emitter of the current monitoring element, which divides a voltage of the drive signal applied to the gate of the output element, and which applies an obtained voltage to the gate of the current monitoring element;

a control circuit which outputs the drive signal and which controls the switching of the output element;

a current detection resistor configured to output a sense current detection signal, which is a voltage generated at the current detection resistor by a sense current output from the current monitoring element; and an overcurrent detection circuit which detects an overcurrent state of the output element by comparing the sense current detection signal with a reference voltage.

8. The overcurrent protection device according to claim 7, wherein:

the voltage division circuit includes a first resistor and a second resistor connected in series;

the current detection resistor has two ends that are respectively a first end and a second end;

the output element further has a collector and an emitter;

the current monitoring element further has a collector;

the first resistor has one end thereof connected to the gate of the output element and an output end of the control circuit, and the other end thereof connected to the gate of the current monitoring element;

the second resistor has one end thereof connected to said the other end of the first resistor, and the other end thereof connected to the sense emitter of the current monitoring element, the first end of the current detection resistor, and an input end of the overcurrent detection circuit;

the collector of the output element is connected to the collector of the current monitoring element and the power supply voltage; and the emitter of the output element is connected to the second end of the current detection resistor and the load.

* * * * *